US012787566B2

(12) United States Patent
Ban et al.

(10) Patent No.: US 12,787,566 B2
(45) Date of Patent: Nov. 3, 2026

(54) DISPLAY DEVICE AND METHOD FOR MANUFACTURING OF THE SAME

(71) Applicant: LG Display Co., Ltd., Seoul (KR)

(72) Inventors: Myungho Ban, Seoul (KR); Dongik Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 406 days.

(21) Appl. No.: 18/478,414

(22) Filed: Sep. 29, 2023

(65) Prior Publication Data

US 2024/0224622 A1 Jul. 4, 2024

(30) Foreign Application Priority Data

Dec. 30, 2022 (KR) ........................ 10-2022-0191291

(51) Int. Cl.
*H10K 59/124* (2023.01)
*H10K 59/122* (2023.01)

(52) U.S. Cl.
CPC ......... *H10K 59/124* (2023.02); *H10K 59/122* (2023.02)

(58) Field of Classification Search
CPC .. H10K 59/124; H10K 59/122; H10K 50/844; H10K 59/12; H10K 50/805; H10K 59/1201; H10K 59/131; H10K 59/805; H10K 59/873; H10K 71/00; H10K 50/11; H10K 50/81; H10K 59/80521; H10K 59/80522
See application file for complete search history.

(56) References Cited

U.S. PATENT DOCUMENTS

| | | | |
|---|---|---|---|
| 2020/0258960 | A1 | 8/2020 | Choi |
| 2021/0202655 | A1 | 7/2021 | Cho et al. |
| 2022/0406861 | A1 | 12/2022 | Yang et al. |

(Continued)

FOREIGN PATENT DOCUMENTS

| | | | |
|---|---|---|---|
| CN | 110890406 | A | 3/2020 |
| CN | 115497988 | A | 12/2022 |
| DE | 102020135109 | A1 | 7/2021 |

(Continued)

OTHER PUBLICATIONS

English Machine Translation of Lin et al WIPO Pub. No. 2022 047 851 (Year: 2026).*

(Continued)

*Primary Examiner* — Mary Ellen Bowman
(74) *Attorney, Agent, or Firm* — Fenwick & West LLP

(57) ABSTRACT

Embodiments of the present disclosure relate to a display device and a method for manufacturing thereof and, in more detail, can provide a display device capable of delaying a time for penetration of moisture and oxygen into a display region. The display device includes a substrate having a display region displaying an image using a plurality of subpixels and a non-display region surrounding the display region, a metal layer disposed on the substrate; a protective layer disposed on the metal layer; and an undercut area disposed along a boundary between the display region and the non-display region, the undercut area including an undercut structure in which an edge of the protective layer protrudes further than a side of the metal layer or a side of the protective layer below the portion.

20 Claims, 24 Drawing Sheets

(56) References Cited

U.S. PATENT DOCUMENTS

2023/0048617 A1 * 2/2023 Kim ........................ H10K 50/19

FOREIGN PATENT DOCUMENTS

| | | | | |
|---|---|---|---|---|
| JP | 2008-135325 A | 6/2008 | | |
| KR | 10-2014-0097685 A | 8/2014 | | |
| KR | 10-2020-0099231 A | 8/2020 | | |
| WO | WO-2022047851 A1 * | 3/2022 | ............. | H10K 71/00 |

OTHER PUBLICATIONS

Intellectual Property Office of the United Kingdom, Combined Search and Examination Report, United Kingdom Patent Application No. GB2319561.3, Jun. 19, 2024, eight pages.

* cited by examiner

DISPLAY DEVICE AND METHOD FOR MANUFACTURING OF THE SAME

CROSS-REFERENCE TO RELATED APPLICATION

This application claims priority benefit from Republic of Korea Patent Application No. 10-2022-0191291, filed on Dec. 30, 2022, the entire contents of which are hereby incorporated by reference for their entirety.

BACKGROUND

Technical Field

Embodiments of the present disclosure relate to a display device and a method for manufacturing thereof.

Description of Related Art

In accordance with development of information society, requests for display devices for displaying images have increased in various forms. In the field of display devices, changes to flat panel display devices (FPD), which are thin and light and are capable of realizing a large area, replacing cathode ray tubes (CRT) of large volumes have been rapidly made. Examples of the flat panel display devices include a liquid crystal display device (LCD), a plasma display panel (PDP), an organic light emitting display device (OLED), and an electrophoretic display device (ED).

Among these, the organic light emitting display device as a self-light emitting element emitting light for itself has advantages of having a high response speed, high light emission efficiency, high luminance, and a wide viewing angle. Particularly, the organic light emitting display device has advantages that it can be formed also on a flexible substrate and can be driven with a voltage lower than those of a plasma display panel and an inorganic electroluminescence (EL) display and has relatively low power consumption and a superior color sense.

SUMMARY

Embodiments of the present disclosure can provide a display device capable of delaying a time for penetration of moisture and oxygen into a display region.

Embodiments of the present disclosure can provide a display device improving light emission quality by preventing or at least reducing occurrence of undesired light emission by preventing or at least reducing a side leakage current.

Embodiments of the present disclosure can provide a display device capable of improving luminance uniformity by alleviating a voltage drop occurring in a second electrode by enhancing resistance of the second electrode.

Embodiments of the present disclosure can provide a display device enabling factory optimization and a method for manufacturing thereof.

Embodiments of the present disclosure can provide a display device including a substrate in which a display region displaying an image using a plurality of subpixels and a non-display region surrounding the display region are provided: a metal layer disposed on the substrate: a protective layer disposed on the metal layer; and an undercut area disposed along a boundary between the display region and the non-display region, the undercut area including an undercut structure in which an edge of the protective layer is projected.

Embodiments of the present disclosure can provide a display device including a plurality of subpixels each including a light emission area and a non-light emission area: a substrate in which a display region displaying an image using the plurality of subpixels is provided: a metal layer disposed on the substrate: a protective layer disposed on the metal layer; and an undercut area disposed between the light emission areas included in the plurality of subpixels, the undercut area being formed using an undercut structure in which the metal layer enters an inner side of a lower part of the protective layer.

Embodiments of the present disclosure can provide a display device including a substrate in which a display region displaying an image using a plurality of subpixels is provided, a light emitting layer disposed in each of the plurality of subpixels on the substrate, a second electrode disposed on the light emitting layer, and an undercut area including an undercut structure body disposed between the plurality of subpixels, in which the undercut structure body includes: an auxiliary electrode disposed on the substrate; and a protective layer disposed on the auxiliary electrode, and the second electrode and the auxiliary electrode are electrically connected to each other.

Embodiments of the present disclosure can provide a method for manufacturing a display device, the method including: forming a metal layer on a substrate: sequentially forming a protective layer and a planarization layer on the metal layer: sequentially patterning the planarization layer and the protective layer: forming an electrode material on the planarization layer, the protective layer, and the metal layer; and simultaneously etching the electrode material and the metal layer, in which the metal layer includes an undercut structure in which the metal layer is etched to an inner side of a lower part of the protective layer.

According to embodiments of the present disclosure, by covering the side face of the light emitting layer with the second electrode, a display device causing it difficult for moisture and oxygen flown in through the side face of the light emitting layer provided on the outermost side of the display device to penetrate the display region and being capable of delaying a time for penetration of moisture and oxygen into the display region can be provided.

According to embodiments of the present disclosure, by disposing the second electrodes to be cut off in the light emission areas of a plurality of subpixels, a display device improving light emission quality by preventing or reducing generation of undesired light emission by preventing or at least reducing a side leakage current can be provided.

According to embodiments of the present disclosure, by electrically connecting the second electrode that is a common electrode to the voltage line through the auxiliary electrode, a display device capable of improving luminance uniformity by alleviating a voltage drop occurring in the second electrode by enhancing resistance of the second electrode can be provided.

According to embodiments of the present disclosure, by using a common mask in formation of a protective layer and a planarization layer and forming an undercut structure by commonly removing the electrode material and the metal layer, a method for manufacturing a display device that enables process optimization can be provided.

DETAILED DESCRIPTION

Figure 1:
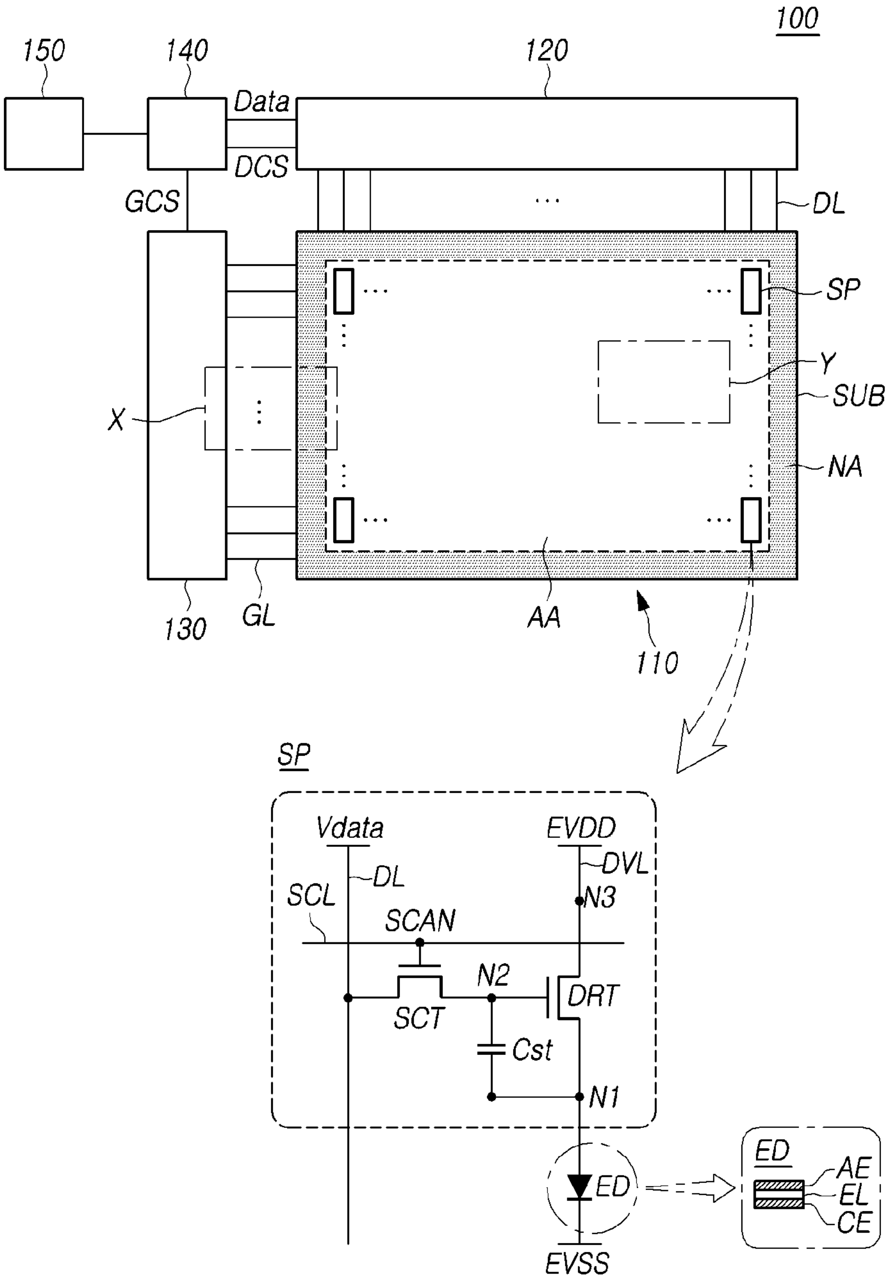
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as “first”, “second”, “A”, “B”, “(A)”, or “(B)” may be used herein to describe elements of the present invention. Each of these terms is not used to define essence, order, sequence, or number of elements etc., but is used merely to distinguish the corresponding element from other elements.

When it is mentioned that a first element “is connected or coupled to”, “contacts or overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “contact or overlap”, etc. each other via a fourth element. Here, the second element may be included in at least one of two or more elements that “are connected or coupled to”, “contact or overlap”, etc. each other.

When time relative terms, such as “after,” “subsequent to,” “next,” “before,” and the like, are used to describe processes or operations of elements or configurations, or flows or steps in operating, processing, manufacturing methods, these terms may be used to describe non-consecutive or non-sequential processes or operations unless the term “directly” or “immediately” is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to the attached drawings.

FIG. 1 is a system configuration diagram of a display device (100) according to embodiments of the present disclosure.

Referring to FIG. 1, a display driving system of the display device (100) according to embodiments of the present disclosure may include a display panel (110) and a display driving circuit for driving the display panel (110).

The display panel (110) may include a display region (AA) in which a video is displayed and a non-display region (NA) in which no video is displayed. The display panel (110) may include multiple subpixels (SP) disposed on a substrate (SUB) for video display.

The display panel (110) may include multiple signal wirings disposed on the substrate (SUB). For example, the multiple signal wirings may include data lines (DL), gate lines (GL), drive voltage lines, and the like.

Each of multiple data lines (DL) may be extending in a first direction (for example, a column direction or a row direction), and each of multiple gate lines (GL) may be extending in a direction intersecting with the first direction.

The display driving circuit may include a data driving circuit (120), a gate driving circuit (130), and the like and may further include a controller (140) used for controlling the data driving circuit (120) and the gate driving circuit (130).

The data driving circuit (120) may output data signals (also referred to as data voltages) corresponding to a video signal to multiple data lines (DL). The gate driving circuit (130) may generate gate signals and output the gate signals to multiple gate lines (GL). The controller (140) may convert input video data input by an external host (150) in accordance with a data signal format used by the data driving circuit (120) and supply the converted video data to the data driving circuit (120).

The data driving circuit (120) may include one or more source driver integration circuits. For example, each source driver integration circuit may be connected to the display panel (110) using a tape automated bonding (TAB) method, may be connected to a bonding pad of the display panel (110) using a Chip On Glass (COG) or Chip On Panel (COP) method, or may be implemented using a Chip On Film (COF) method and connected to the display panel (110).

The gate driving circuit (130) may be connected to the display panel (110) using a tape automated bonding (TAB) method, may be connected to a bonding pad of the display panel (110) using a COG or COP method, may be connected to the display panel (110) using a COF method, or may be formed in a non-display region (NA) of the display panel (110) as a Gate In Panel (GIP) type.

Referring to FIG. 1, in the display device (100) according to embodiments of the present disclosure, each subpixel (SP) may include a light emitting element (ED) and a pixel driving circuit (SPC) used for driving this, and the pixel driving circuit (SPC) may include a drive transistor (DRT), a scan transistor (SCT), and a storage capacitor (Cst).

The drive transistor (DRT) may drive the light emitting element (ED) by controlling a current flowing through the light emitting element (ED). The scan transistor (SCT) may transfer a data voltage (Vdata) to a second node (N2) that is a gate node of the drive transistor (DRT). The storage capacitor (Cst) may be configured to maintain a voltage for a predetermined period.

The light emitting element (ED) may include an anode electrode (AE) and a cathode electrode (CE) and a light emitting layer (EL) positioned between the anode electrode (AE) and the cathode electrode (CE). The anode electrode (AE) may be a pixel electrode participating in formation of the light emitting element (ED) of each subpixel (SP) and may be electrically connected to a first node (N1) of the drive transistor (DRT). The cathode electrode (CE) may be a common electrode participating in formation of light emitting elements (ED) of all the subpixels (SP) and may be applied with a base voltage (EVSS).

For example, the light emitting element (ED) may be an Organic Light Emitting Diode (OLED), a light emitting diode (LED) based on an inorganic material, a quantum dot light emitting element that is a self-light emitting semiconductor crystal, or the like.

The drive transistor (DRT) is a transistor used for driving the light emitting element (ED) and may include a first node (N1), a second node (N2), a third node (N3), and the like. The first node (N1) is a source or a drain node and may be electrically connected to the anode electrode (AE) of the light emitting element (ED). The second node (N2) is a gate node and may be electrically connected to a source or a drain node of the scan transistor (SCT). This third node (N3) may be a drain or a source node and may be electrically connected to a drive voltage line (DVL) supplying a drive voltage (EVDD). Hereinafter, for the convenience of description, an example in which the first node (N1) is a source node, and the third node (N3) is a drain node will be described.

The scan transistor (SCT) may perform switching of connection of the data line (DL) and the second node (N2) of the drive transistor (DRT). The scan transistor (SCT) may control connection between the second node (N2) of the drive transistor (DRT) and a corresponding data line (DL) among multiple data lines (DL) in response to a scan signal (SCAN) supplied from a scan line (SCL) that is one type of gate line (GL).

The storage capacitor (Cst) may be configured between the first node (N1) and the second node (N2) of the drive transistor (DRT).

The structure of the subpixel (SP) illustrated in FIG. 1 is an example for description and may additionally include one or more transistors or may additionally include one or more capacitors. Alternatively, multiple subpixels may be configured to have the same structure, or some of multiple subpixels may be configured to have a different structure. Each of the drive transistor (DRT) and the scan transistor (SCT) may be either an n-type transistor or a p-type transistor.

The display device (100) according to embodiments of the present disclosure may have either a top emission structure or a bottom emission structure. Hereinafter, an example in which the display device (100) has the top emission structure will be described. For example, in the case of the top emission structure, the anode electrode (AE) may be formed of reflective metal, and the cathode electrode (CE) may be formed of a transparent conductive film.

Figure 2A:
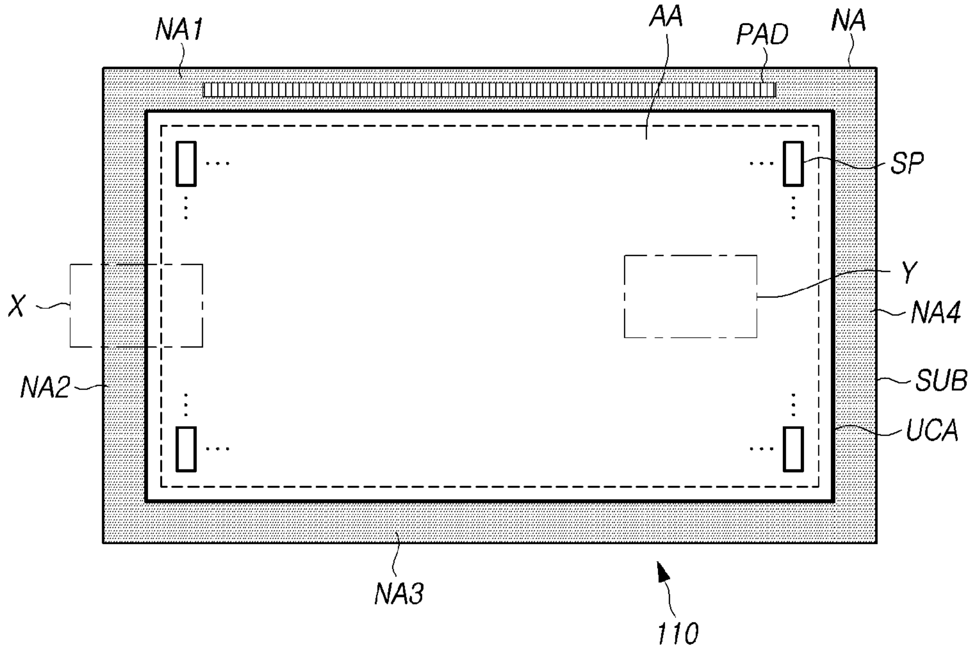
FIGS. 2A and 2B are exemplary diagrams illustrating examples of a position at which an undercut area is provided in a display panel applied to a display device according to embodiments of the present disclosure.
Figure 2B:
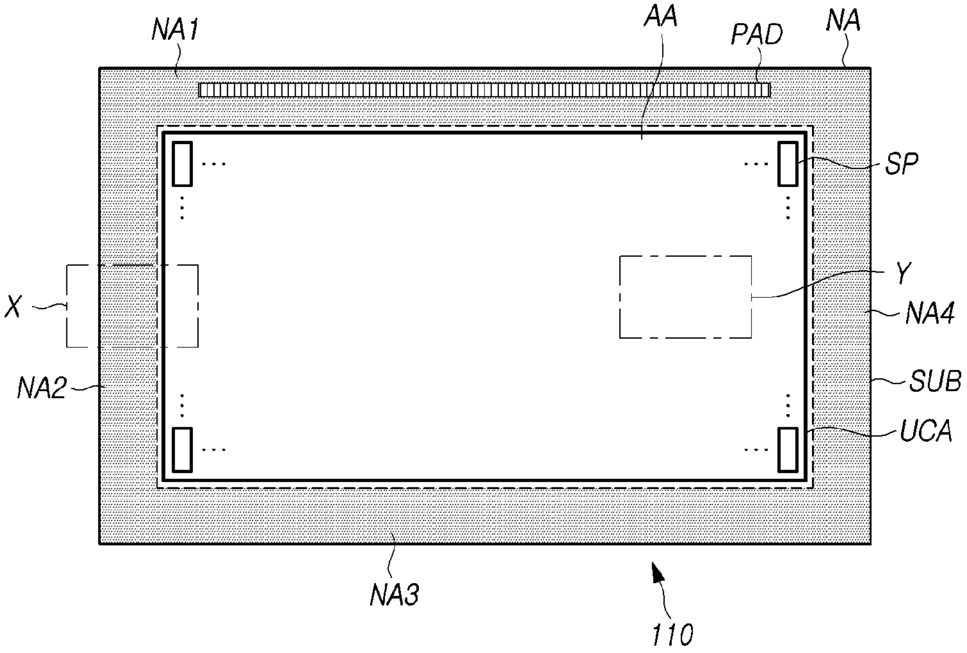

FIGS. 2A and 2B are exemplary diagrams illustrating examples of a position at which an undercut area is provided in a display panel applied to the display device according to the embodiments of the present disclosure.

Referring to FIGS. 2A and 2B, in the display panel (110) applied to the display device according to embodiments of the present disclosure, a non-display region (NA) surrounds a display region (AA). The non-display region (NA) includes a first non-display region (NA1) in which the data driving circuit (120) is provided, a second non-display region (NA2) in which the gate driving circuit (130) is provided, a third non-display region (NA3) that faces the first non-display region (NA1), and a fourth non-display region (NA4) that faces the second non-display region (NA2).

Referring to FIGS. 2A and 2B, an undercut area (UCA) may be disposed along a boundary between the display region (AA) and the non-display region (NA) of the display panel (110). The undercut area (UCA) may be disposed in any one of the display region (AA) and the non-display region (NA) or may be disposed in both the regions.

For example, referring to FIG. 2A, the undercut area (UCA) may be disposed in the non-display region (NA) along the boundary between the display region (AA) and the non-display region (NA). In addition, referring to FIG. 2B, the undercut area (UCA) may be disposed in the display region (AA) along the boundary between the display region (AA) and the non-display region (NA).

The undercut area (UCA) may be disposed along a boundary line between the display region (AA) and at least one display region among first to fourth non-display regions (NA4). For example, the undercut area (UCA) may be disposed along a boundary line between the display region (AA) and the second non-display region (NA2), or the undercut area (UCA) may be disposed along a boundary line between the display region (AA) and the first non-display region (NA1) and the second non-display region (NA2). The undercut area (UCA) may be disposed along a boundary line between the display region (AA) and the first non-display region (NA1) and the third non-display region (NA3), or the undercut area (UCA) may be disposed along a boundary line between the display region (AA) and the second non-display region (NA2) and the fourth non-display region (NA4). The undercut area (UCA) may be disposed along a boundary line between the display region (AA) and all the first to fourth non-display regions (NA4).

The undercut area (UCA) may be disposed along the boundary line of the first non-display region (NA1) continuously or partially. The undercut area (UCA) may be continuously disposed along a boundary line of non-display regions that are adjacent to each other. For example, in a case in which the undercut area (UCA) is disposed along a boundary line between the display region (AA) and the first non-display region (NA1) and the second non-display region (NA2), the undercut area (UCA) may be continuously disposed along a boundary line between the first non-display region (NA1) and the second non-display region (NA2).

Figure 3A:
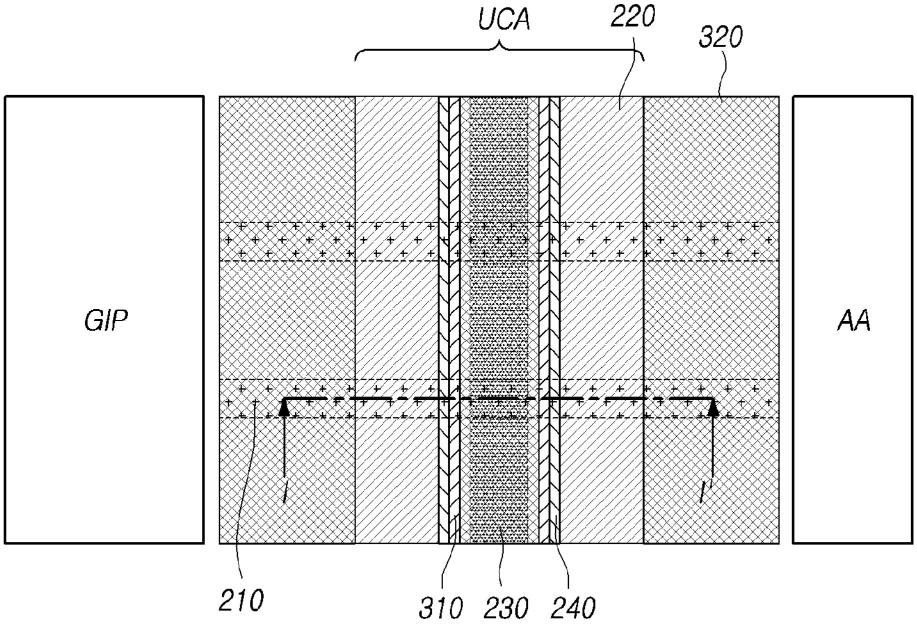
FIGS. 3A to 3C are exemplary diagrams illustrating examples of an undercut area provided in an area X illustrated in FIGS. 2A and 2B according to embodiments of the present disclosure.
Figure 3B:
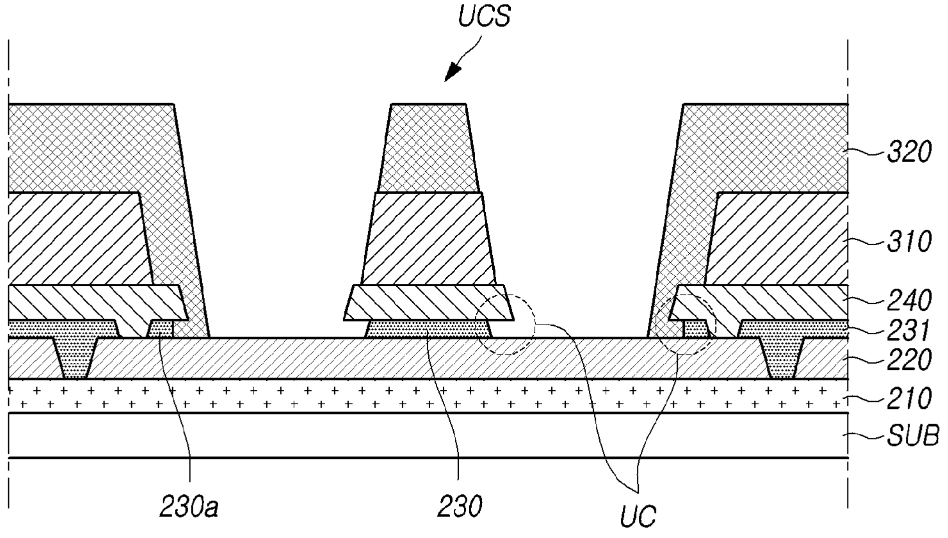
Figure 3C:
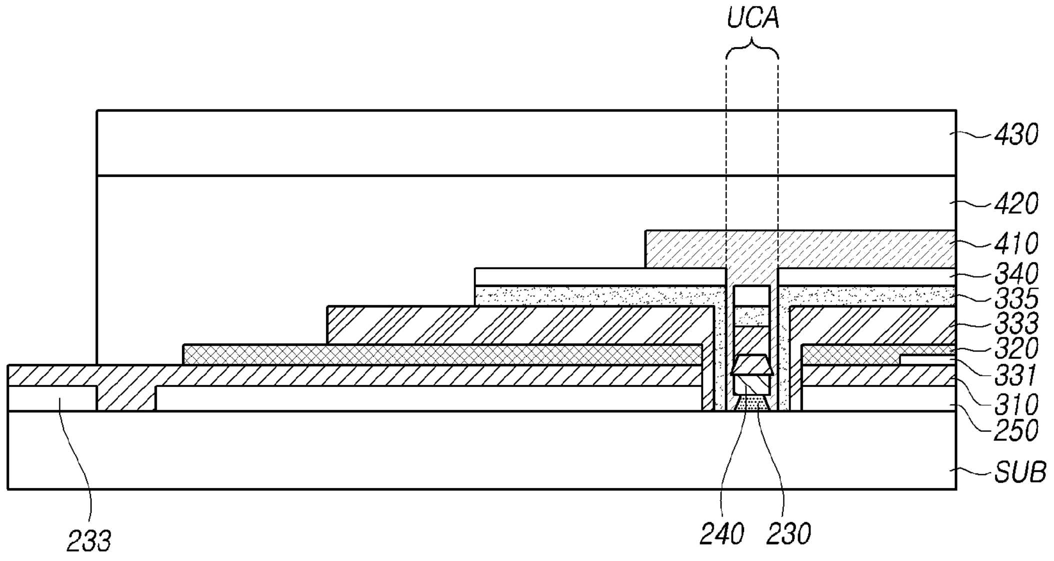

FIGS. 3A to 3C are exemplary diagrams illustrating examples of an undercut area provided in an area X illustrated in FIGS. 2A and 2B. For example, FIG. 3A is a plan view illustrating an undercut area provided in the area X illustrated in FIGS. 2A and 2B, FIG. 3B is a cross-sectional view illustrating the undercut area provided in the area X illustrated in FIGS. 2A and 2B, and FIG. 3C is a cross-sectional view including an encapsulation part in the undercut area provided in the area X illustrated in FIGS. 2A and 2B.

In the following description, embodiments of the present disclosure using a second non-display region (NA2) in which, particularly, a gate driving circuit (130) of a GIP type is provided among non-display regions (NA) will be described. In a case in which a gate driving circuit (130) of a GIP type is also provided in a fourth non-display region (NA4) facing the second non-display region (NA2), the structure of the fourth non-display region (NA4) may be the same as the structure of the second non-display region (NA2). A first non-display region (NA1) and a third non-display region (NA3) may have an undercut area and a structure that are the same as the undercut area and the structure of the second non-display region (NA2) except that no gate driving circuit (130) is provided in the first non-display region (NA1) and the third non-display region (NA3).

Referring to FIGS. 3A to 3C, a display device (100) according to embodiments of the present disclosure may include: a display region AA displaying an image using a plurality of subpixels: a substrate (SUB) which is in a non-display region (NA) surrounding the display region (AA); a metal layer (230, 231) disposed on the substrate (SUB); a protective layer (240) disposed on the metal layer (230 and 231); and an undercut area (UCA) disposed along a boundary between the display region (AA) and the non-display region (NA), and the undercut area (UCA) may include an undercut structure (UC) in which an edge of the protective layer (240) is projected.

The display device (100) according to the embodiments of the present disclosure may include: a planarization layer (310) disposed on the protective layer (240); first electrodes (331) disposed on the planarization layer (310); a bank layer (320) disposed between the first electrodes (331); a light emitting layer (333) disposed on the first electrode (331) and the bank layer (320); second electrodes disposed on the light emitting layer (333); a capping layer (340) disposed on the second electrodes (335); a passivation layer (410) covering the capping layer (340): an encapsulation layer (420) disposed on an upper face of the passivation layer (410), and an encapsulation substrate (430) disposed on the encapsulation layer (420).

The display device (100) according to the embodiments of the present disclosure may include an undercut structure body (UCS) disposed in the undercut area (UCA) along the display region (AA).

Referring to FIGS. 3A to 3C, the substrate (SUB) may be a glass substrate or a plastic substrate and may be formed using various types of film other than those.

A light shield layer (210) may be disposed on the substrate (SUB).

The light shield layer (210) may be a plurality of signal lines. For example, the plurality of signal lines may be a GIP output line, a data line, a reference voltage line, a drive voltage line, and the like.

A buffer layer (220) may be disposed on the plurality of signal lines.

The buffer layer (220) has a role for protecting thin film transistors (not illustrated) formed in a subsequent process from impurities such as alkali ions flowing out from the substrate (SUB). The buffer layer (220) may be a single layer of a silicon oxide (SiOx) or a silicon nitride (SiNx) or multiple layers of those.

The metal layer (230, 231) may be disposed on the buffer layer (220). The metal layer (230, 231) may be a gate line (231). The metal layer (230, 231) may contain any one of metals such as aluminum (Al), gold (Au), silver (Ag), copper (Cu), tungsten (W), molybdenum (Mo), chrome (Cr), tantalum (Ta), titanium (Ti), and the like or alloys thereof, and the present disclosure is not limited thereto.

The protective layer (240) may be disposed on the metal layer (230, 231).

As an insulating film used for protecting elements disposed on a lower side thereof, the protective layer (240) may contain one or more inorganic insulating materials among silicon oxide (SiOx), silicon oxynitride (SiON), and silicon nitride (SiNx) and may be either a single layer or multiple layers thereof.

As illustrated in FIGS. 2A and 2B, a display device 100 includes a substrate SUB comprising a display region AA displaying an image using a plurality of subpixels and a non-display region NA surrounding the display region AA. The display device also includes an undercut area UCA between the display region and the non-display region.

Referring to FIG. 3B, the display device also includes a metal layer 230 disposed on the substrate SUB. At least a part of the metal layer is disposed in the undercut area UCA. The display device also includes a protective layer 240 disposed on the metal layer 230. At least a portion of the protective layer 240 protrudes further than a side of the meta layer 230 or a side of the protective layer below the portion of the protective layer to form an undercut structure UC. The undercut structure exposes a lower surface of the protruding portion of the protective layer 240.

In some embodiments, a metal pattern 230*a* is disposed in a space formed by the lower surface of the protruding portion of the protective layer 240 and the side of the protective layer below the protruding portion of the protective layer. The protruding portion of the protective layer protrudes further than a side of the metal pattern 230*a* to form the undercut structure UC. As illustrated in FIG. 3B, the undercut area (UCA) may include an undercut structure (UC) in which the metal pattern (230*a*) enters an inner side of a lower part of the protective layer (240). In other words, an edge of the protective layer (240) may be disposed to be projected to an outer side of an edge of the metal pattern (230*a*).

Referring to FIG. 3B, an undercut structure body (UCS) including an undercut structure (UC) in which an edge of the protective layer (240) is projected may be disposed in the undercut area (UCA). A part of the metal layer 230, a part of the protective layer 240, and the undercut structure UC are included in the undercut structure. The portion of the protective layer 240 protrudes further than the side of the protective layer. In some embodiments, a second portion of the protective layer 240 protrudes further than a second side of the metal layer 230.

The undercut structure body (UCS) may be formed of an undercut structure (UC) in which a metal layer (230) is included under the protective layer (240), and the metal layer (230) enters an inner side of a lower part of the protective layer (240).

A planarization layer (310) may be disposed on the protective layer (240).

Referring to FIG. 3C, a pixel driving circuit layer (250) including a light shield layer, a buffer layer, a metal layer, a protective layer, and the like may be disposed on the substrate (SUB), the pixel driving circuit layer (250) may include a pixel driving circuit including a drive transistor.

The planarization layer (310) can alleviate height level differences in the structure according to elements and patterns disposed thereunder. The planarization layer (310) may be formed using at least one organic film but is not limited thereto. For example, the planarization layer (310) may be formed using at least one inorganic film and at least one inorganic film.

Light emitting elements (330) may be disposed on the planarization layer (310).

The light emitting element (330) may include a first electrode (331), a light emitting layer (333), and a second electrode (335).

The first electrode (331) is a pixel electrode functioning as an anode and may be independently disposed in each subpixel.

The first electrode (331) may be formed using metals, an alloy thereof, or a combination of a metal and a metal oxide and may include a transparent conductive material. The first electrode (331) may also be formed using a transparent electrode, a non-transparent electrode, or lamination of a transparent electrode and a non-transparent electrode. In addition, the first electrode (331) may be a semi-transmissive electrode or a reflective electrode.

For example, the first electrode (331) may be formed using one of ITO, IZO, ITZO, ITO/APC/ITO, AlNd/ITO, Ag/ITO, and ITO/APC/ITO.

The bank layer (320) may be disposed to cover outer sides of the first electrode (331). In accordance with this, an opening through which light is output may be formed in one pixel. In other words, the bank layer (320) is provided in the display region and the non-display region, an opening through which the first electrode (331) of each pixel is exposed is formed in the bank layer (320) provided in the display region, and light can be output through the opening.

The bank layer (320) may be formed using at least one inorganic film or at least one organic film. In addition, the bank layer (320) may be formed by stacking at least one inorganic film and at least one organic film.

The bank layer (320) may cover the undercut structure (UC) in the undercut area (UCA). In other words, the bank layer (320) may cover an edge of the protective layer (240) and the metal pattern (230*a*) entering an inner side of a lower part of the protective layer (240).

The light emitting layer (333) may be disposed to cover the first electrode (331) and the bank layer (320).

The light emitting layer (333) may include any one of an organic light emitting layer, an inorganic light emitting layer, and a quantum dot light emitting layer. In addition, the light emitting layer (333) may include a lamination structure or a mixing structure of an organic light emitting layer (or an inorganic light emitting layer) and a quantum dot light emitting layer.

In order to improve light emission efficiency, the light emitting layer (333) may be composed of multiple layers including a hole injection layer, a hole transport layer, an emitting material layer, an electron transport layer, and an electron injection layer.

A second electrode (335) is disposed on the light emitting layer (333). In some embodiments, a first portion of the light emitting layer 333 is in the undercut area, and a second portion of the light emitting layer is in an area adjacent to the undercut area. In some embodiments, a first portion of the second electrode is in the undercut area, and a second portion of the second electrode is in an area adjacent to the undercut area. The first portion of the light emitting layer and the first portion of the second electrode in the undercut area are electrically disconnected from the second portion of the light emitting layer and the second portion of the second electrode in the area adjacent to the undercut area by the undercut structure.

The second electrode (335) is a common electrode functioning as a cathode and may be disposed to be common to all the subpixels.

The second electrode (335) may be either a semi-transmissive electrode or a reflective electrode. In addition, the second electrode (335) may be formed using a transparent electrode, a non-transparent electrode, or lamination of a transparent electrode and a non-transparent electrode.

For example, the second electrode (335) may be composed of any one selected from a group comprising silver (Ag), aluminum (Al), magnesium (Mg), chrome (Cr), titanium (Ti), nickel (Ni), tungsten (W), gold (Au), tantalum (Ta), copper (Cu), cobalt (Co), iron (Fe), Molybdenum (Mo), and platinum (Pt) or an alloy of the metals described above.

For example, in a case in which a display device according to embodiments of the present disclosure uses a top emission type in which light is output to the outside through the second electrode (335), the second electrode (335) may be formed using a transparent metal such as ITO or IZP or may be formed using a metal-mixed material including magnesium (Mg) and silver (Ag). In such a case, the first electrode (331) may be configured to include a transparent electrode and a reflective electrode.

On the other hand, in a case in which a display device according to embodiments of the present disclosure uses a bottom emission type in which light is output to the outside through the first electrode (331), the second electrode (335) may be formed using a material such as aluminum (AL) having a reflection characteristic, and the first electrode (331) may be formed using various types of transparent metal.

A display device according to embodiments of the present disclosure can be applied to both a light emission display device using the bottom emission type and a light emission display device using the top emission type.

A capping layer (340) may be disposed on the second electrode (335). The capping layer (340) may have a function for protecting the second electrode (335).

Referring to FIG. 3C, the light emitting layer (333) and the second electrode (335) may be disposed in the undercut area (UCA) with being cut off in accordance with the undercut structure (UC). In the undercut area (UCA), the light emitting layer (333) and the second electrode (335) may cover side faces of the pixel driving circuit layer (250), the planarization layer (310), and the bank layer (320). The pixel driving circuit layer (250) may include at least one of a light shield layer, a buffer layer, a metal layer, and a protective layer.

Referring to FIG. 3C, a side face of the light emitting layer (333) provided in the undercut area (UCA) may be covered with the second portion of the second electrode (335). A passivation layer (410) may be disposed on the capping layer (340).

An encapsulation layer (420) and an encapsulation substrate (430) may be disposed on the passivation layer (410). The encapsulation layer (420) may cover side faces and an upper face of the passivation layer (410).

As illustrated in FIG. 3C, the encapsulation layer (420) may cover side faces of the planarization layer (103), the bank (104), the light emitting layer (105), the cathode electrode (106), and the capping layer (107) and the upper face of the capping layer (107) provided under the encapsulation layer (420). Thus, the encapsulation layer (420)

may also perform an encapsulation function for blocking the constituent elements described above from the outside.

The encapsulation substrate (430) may be formed using at least one inorganic film or at least one organic film, may be formed by laminating at least one inorganic film and at least one organic film, or may be a metal encapsulation layer.

In such a case, the encapsulation layer (420) and the encapsulation substrate (430) may be configured using an adhesive layer (FSP) and a metal encapsulation layer (FSM).

According to the embodiments of the present disclosure, by covering the side face of the light emitting layer (333) with the second electrode (335), a display device causing it difficult for moisture and oxygen flown in through the side face of the light emitting layer provided on the outermost side of the display device to penetrate the display region and being capable of delaying a time for penetration of moisture and oxygen into the display region can be provided.

Figure 4A:
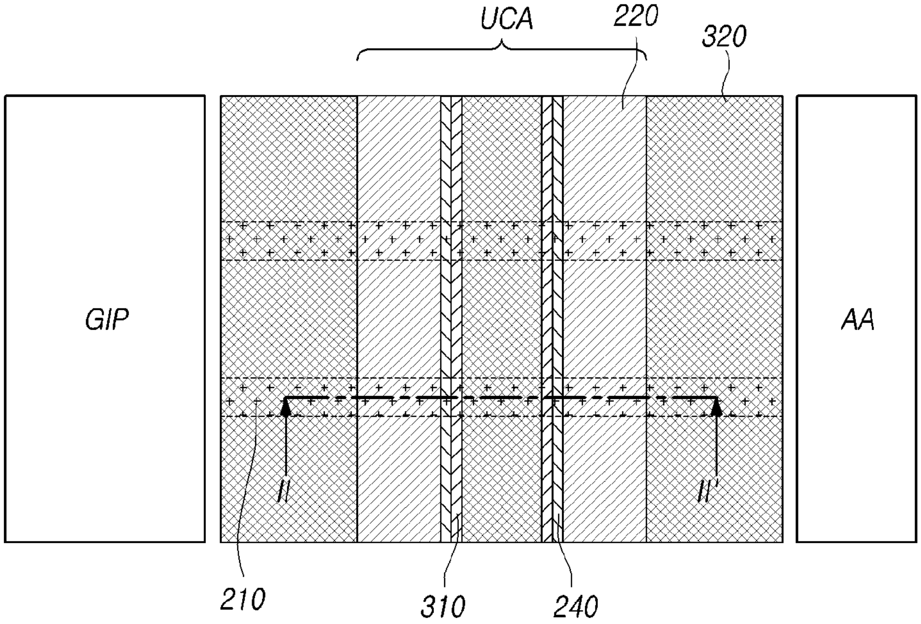
FIGS. 4A to 4C are exemplary diagrams illustrating other examples of an undercut area provided in the area X illustrated in FIGS. 2A and 2B according to embodiments of the present disclosure.
Figure 4B:
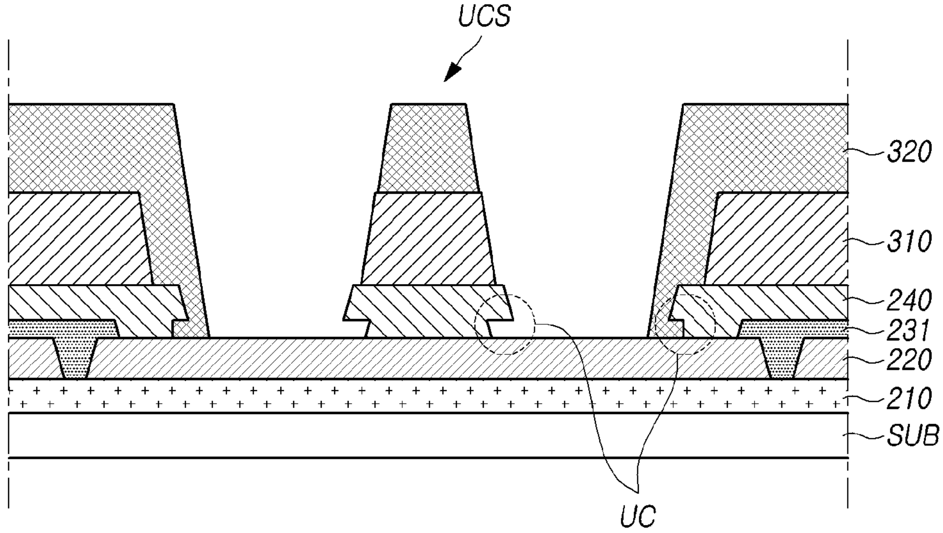
Figure 4C:
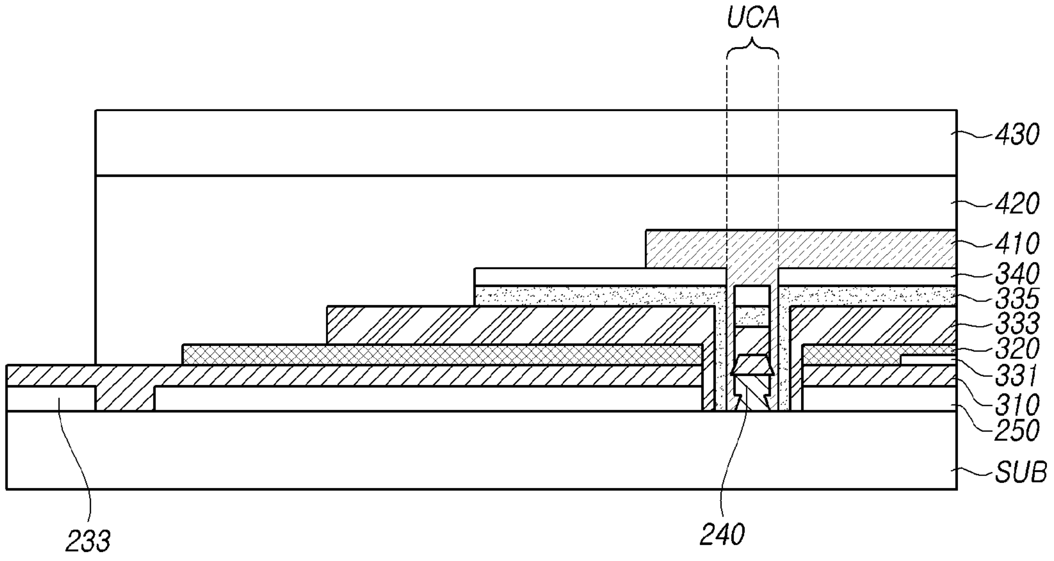

FIGS. 4A to 4C are exemplary diagrams illustrating other examples of an undercut area provided in the area X illustrated in FIGS. 2A and 2B. For example, FIG. 4A is a plan view illustrating another example of an undercut area provided in the area X illustrated in FIGS. 2A and 2B, FIG. 4B is a cross-sectional view illustrating another example of an undercut area provided in the area X illustrated in FIGS. 2A and 2B, and FIG. 4C is a cross-sectional view including an encapsulation unit as another example of an undercut area provided in the area X illustrated in FIGS. 2A and 2B.

FIGS. 4A to 4C have the same configuration as that of the undercut area (UCA) illustrated in FIGS. 3A to 3C except that the metal layer (230) and the metal pattern (230*a*) are removed, and thus details that are the same as or similar to the details described with reference to FIGS. 3A to 3C will be omitted or briefly described.

Referring to FIGS. 4A to 4C, a display device according to embodiments of the present disclosure includes an undercut area (UCA) disposed along a boundary between a display region and a non-display region, and the undercut area (UCA) may include an undercut structure (UL) in which an edge of a protective layer (240) is projected.

In addition, the undercut area (UCA) may include an undercut structure body (UCS) disposed in the undercut area (UCA) along the display region. The undercut structure body (UCS) may include an undercut structure (UC) in which an edge of a protective layer (240) is projected.

Referring to FIG. 4B, a bank layer (320) may cover the undercut structure (UC) in the undercut area (UCA). In other words, the bank layer (320) may cover an edge of the protective layer (240) and an inner side of a lower part of the protective layer (240).

Referring to FIG. 4C, a light emitting layer (333) and a second electrode (335) may be disposed in the undercut area (UCA) with being cut off in accordance with the undercut structure (UC). In the undercut area (UCA), the light emitting layer (333) and the second electrode (335) may cover side faces of the pixel driving circuit layer (250), the planarization layer (310), and the bank layer (320). The pixel driving circuit layer (250) may include at least one of a light shield layer, a buffer layer, a metal layer, and a protective layer.

Referring to FIG. 4C, a side face of the light emitting layer (333) provided in the undercut area (UCA) may be covered with the second electrode (335).

According to the embodiments of the present disclosure, by covering the side face of the light emitting layer (333) with the second electrode (335), a display device causing it difficult for moisture and oxygen flown in through the side face of the light emitting layer provided on the outermost side of the display device to penetrate the display region and being capable of delaying a time for penetration of moisture and oxygen into the display region can be provided.

Figure 5:
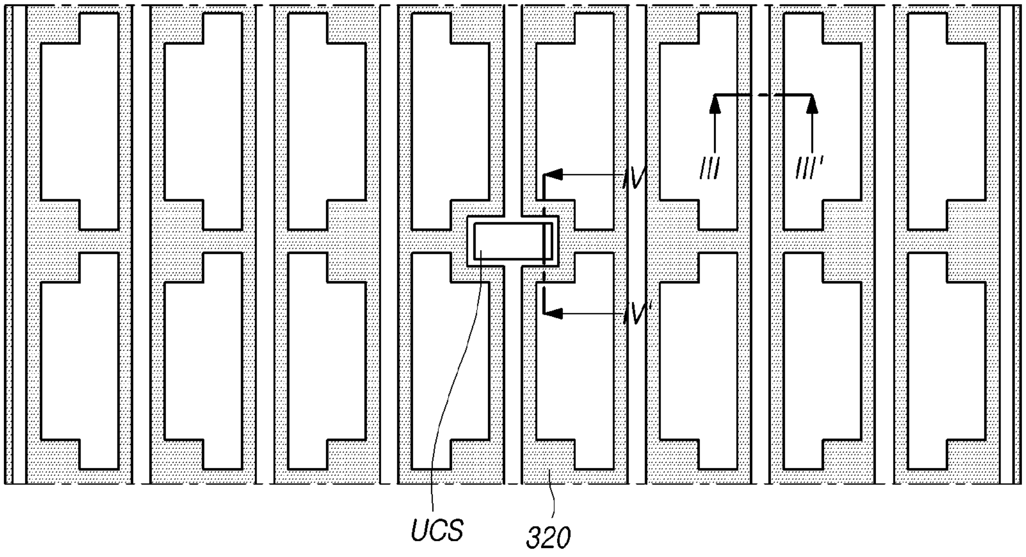
FIG. 5 is an exemplary diagram illustrating an example of a layout structure of pixels arranged in an area Y illustrated in FIGS. 2A and 2B according to embodiments of the present disclosure.

FIG. 5 is an exemplary diagram illustrating an example of a layout structure of pixels arranged in an area Y illustrated in FIGS. 2A and 2B.

Referring to FIG. 5, a display device according to embodiments of the present disclosure may include: a plurality of subpixels each including a light emission area and a non-light emission area: a display region in which an image is displayed using the plurality of subpixels: and a non-display region surrounding the display region.

The light emission area is an area in which light is emitted through an opening in a subpixel, and the non-light emission area represents an area in which light is not emitted.

Referring to FIG. 5, an undercut area may be included between a light emission area and a light emission area included in a plurality of subpixels or between a plurality of subpixels.

Figure 6:
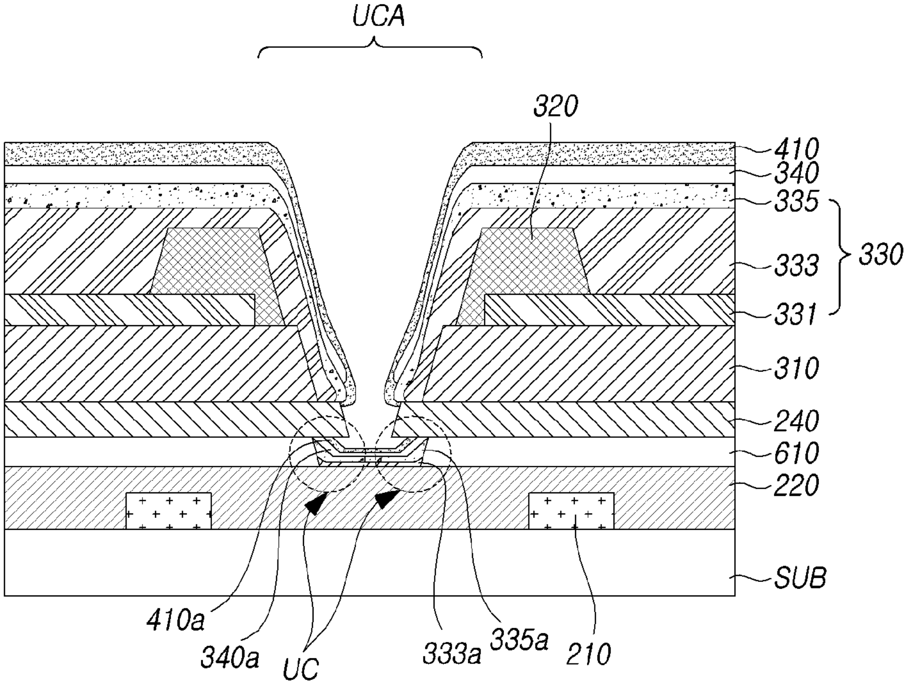
FIG. 6 is an exemplary diagram illustrating an example of a cross-sectional structure of subpixels cut along line III-III' illustrated in FIG. 5 according to embodiments of the present disclosure.

FIG. 6 is an exemplary diagram illustrating an example of a cross-sectional structure of subpixels cut along line III-III' illustrated in FIG. 5. In the following description, details that are the same as or similar to the details described with reference to FIGS. 1 to 5 will be omitted or briefly described.

Referring to FIGS. 5 and 6, a display device (100) according to embodiments of the present disclosure may include: a substrate (SUB); a light shield layer (210) disposed on the substrate (SUB); a buffer layer (220) disposed on the light shield layer (210); a metal layer (610) disposed on the buffer layer (220): a protective layer (240) disposed on the metal layer (610): a planarization layer (310) disposed on the protective layer (240): first electrodes (331) disposed on the planarization layer (310); a bank layer (320) disposed between the first electrodes (331); a light emitting layer (333) disposed on the first electrodes (331) and the bank layer (320): second electrodes (335) disposed on the light emitting layer (333): a capping layer (340) disposed on the second electrodes (335); and a passivation layer (410) covering the capping layer (340).

Referring to FIGS. 5 and 6, a display device according to embodiments of the present disclosure includes: a plurality of subpixels each including a light emission area and a non-light emission area: a substrate (SUB) in which a display region displaying an image using a plurality of subpixels is provided: a metal layer (610) disposed on the substrate (SUB): a protective layer (240) disposed on the metal layer (610); and an undercut area (UCA) disposed between the light emission areas included in the plurality of subpixels, and the undercut area (UCA) may include an undercut structure (UC) in which the metal layer (610) enters an inner side of a lower part of the protective layer (240).

Referring to FIG. 6, first electrodes (331) disposed on the protective layer (240), a light emitting layer (333) disposed on the first electrodes (331), and second electrodes (335) disposed on the light emitting layer (333) may be included.

Referring to FIG. 6, a display device includes a substrate SUB having a display region and a plurality of subpixels on the substrate SUB in the display region. The plurality of subpixels include a plurality of light emission areas and anon-light emission area. Each of the plurality of light emission areas corresponds to one of the plurality of subpixels, and the non-light emission area is between the plurality of light emission areas. The display device also includes a metal layer 230 disposed on the substrate SUB in the display region, and a protective layer 240 disposed on the metal layer. At least a portion of the protective layer protrudes further than a side of the metal layer to form an undercut structure UC, and the undercut structure exposes a lower surface of the protruding portion of the protective layer.

In some embodiments, the display device further includes a first electrode 331 of a subpixel disposed on the protective layer 240, a light emitting layer 333 of the subpixel disposed on the first electrode, and a second electrode 335 of the subpixel disposed on the light emitting layer. The light emitting layer 333 of the subpixel and the second electrode 335 of the subpixel are disposed in an undercut area UA, such that the light emitting layer 333 of the subpixel and the second electrode 335 of the subpixel are electrically disconnected from another light emitting layer of another subpixel adjacent to the subpixel and another second electrode 335 of the another subpixel.

As illustrated, the light emitting layer (333) and the second electrode (335) may be disposed in the undercut area (UCA) with being cut off in accordance with the undercut structure (UC). In other words, in the light emission areas of subpixels adjacent to each other among a plurality of subpixels, the light emitting layer (333) is not continuously disposed but is disposed with being cut off. In addition, in light emission areas of subpixels adjacent to each other among a plurality of subpixels, the second electrodes (335) also are not continuously disposed but are disposed with being cut off.

Below the undercut area (UCA) including the undercut structure (UC), patterns of the light emitting layer (333), the second electrodes (335), the capping layer (340), the passivation layer (410), and the like formed in the subpixel are stacked. In other words, a light emitting layer pattern (333*a*), a second electrode pattern (335*a*), a capping layer pattern (340*a*), and a passivation layer pattern (410*a*) are stacked. The second electrode pattern (335*a*) may be used as a common voltage line (VSSL) supplying a low electric potential common voltage (EVSS).

In other words, the second electrode (335) and the metal layer (610) provided in the undercut area (UCA) may be electrically disconnected in accordance with the undercut structure (UC). The second electrode pattern (335*a*) stacked under the undercut area (UCA) may be electrically connected to the metal layer (610).

Referring to FIG. 6, a side face of the light emitting layer (333) provided in the undercut area (UCA) may be covered with the second electrode (335).

According to embodiments of the present disclosure, by disposing the second electrodes to be cut off in the light emission areas of a plurality of subpixels, a display device improving light emission quality by preventing or at least reducing generation of undesired light emission by preventing or at least reducing a side leakage current can be provided.

In addition, according to embodiments of the present disclosure, by covering the side face of the light emitting layer (333) with the second electrode (335), a display device capable of delaying a time for penetration of moisture and oxygen into the display region in server pixels adjacent to each other can be provided.

Figure 7:
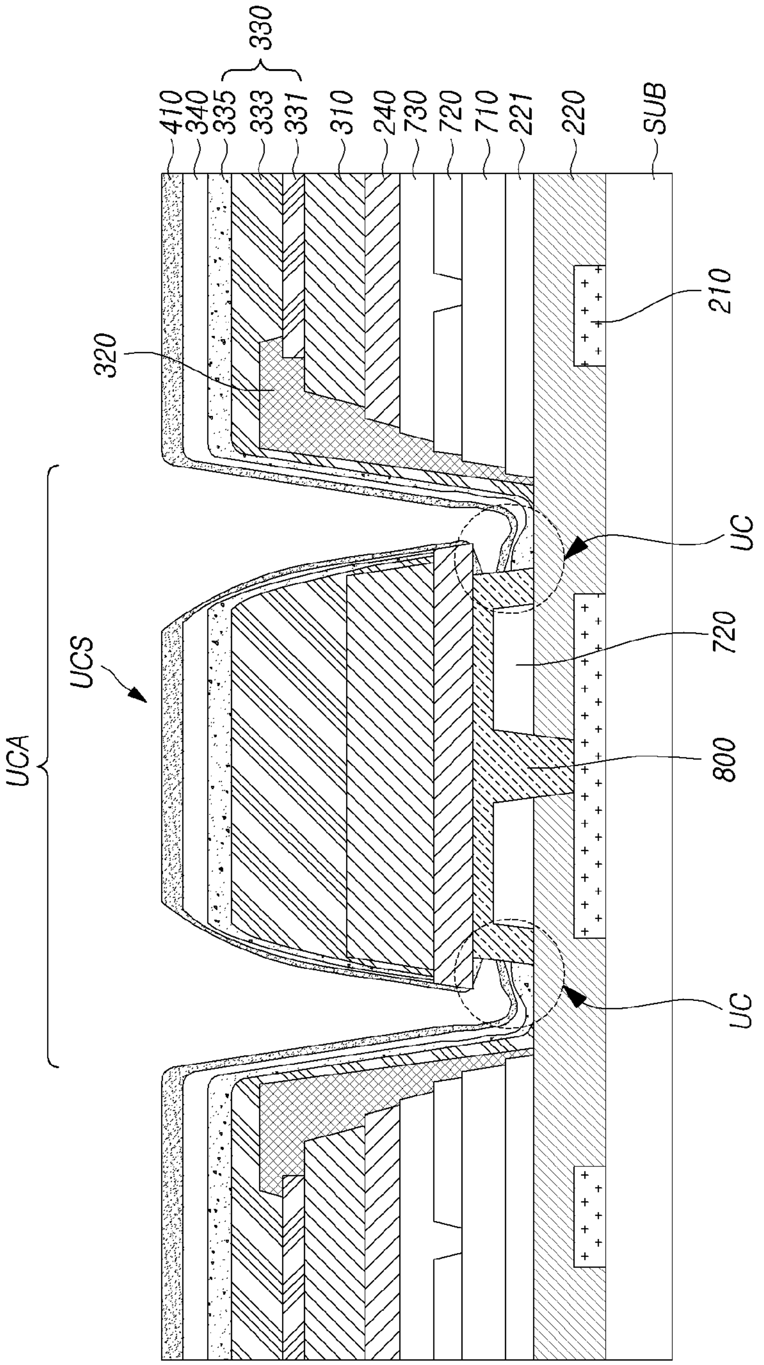
FIG. 7 is an exemplary diagram illustrating an example of a cross-sectional structure of subpixels cut along line IV-IV' illustrated in FIG. 5 according to embodiments of the present disclosure.

FIG. 7 is an exemplary diagram illustrating an example of a cross-sectional structure of subpixels cut along line IV-IV' illustrated in FIG. 5. In the following description, details that are the same as or similar to the details described with reference to FIGS. 1 to 6 will be omitted or briefly described.

Referring to FIGS. 5 and 7, the display device (100) according to embodiments of the present disclosure may include: a substrate (SUB); a light shield layer (210) disposed on the substrate (SUB); a buffer layer (220) disposed on the light shield layer (210); a metal layer (710) disposed on the buffer layer (220): a source/drain electrode (730) disposed on the metal layer (710); a protective layer (240) disposed on the source/drain electrode (730), a planarization layer (310) disposed on the protective layer (240): first electrodes (331) disposed on the planarization layer (310): a bank layer (320) disposed between the first electrodes (331); a light emitting layer (333) disposed on the first electrodes (331) and the bank layer (320): second electrodes (335) disposed on the light emitting layer (333): a capping layer (340) disposed on the second electrodes (335); and a passivation layer (410) covering the capping layer (340).

Referring to FIGS. 5 and 7, a display device according to embodiments of the present disclosure includes: a substrate (SUB) in which a display region displaying an image using a plurality of subpixels is provided: a light emitting layer (333) disposed in each of the plurality of subpixels on the substrate: second electrodes (335) disposed on the light emitting layer (333); and an undercut area (UCA) including an undercut structure body (UCS) disposed between the plurality of subpixels, the undercut structure body (UCS) includes auxiliary electrodes (800) disposed on the substrate (SUB) and a protective layer (240) disposed on the auxiliary electrodes (800), and the second electrode (335) and the auxiliary electrode (800) may be electrically connected to each other. In some embodiments, the undercut structure body UCS is rectangular shaped, and the undercut structure UC is disposed along an outer edge of the rectangular shaped undercut structure body. In some embodiments, the undercut structure body is surrounded by four subpixels, each corresponding to a corner of the rectangular shaped undercut structure body UCS.

In some embodiments, the undercut structure body UCS includes an auxiliary electrode 800 disposed on the substrate SUB in the undercut area UCA and a protective layer 240 disposed on the auxiliary electrode 800 in the undercut area UCA. At least a portion of the protective layer 240 protrudes further than a side of the auxiliary electrode 800 to form an undercut structure UC. The undercut structure UC exposes a lower surface of the protruding portion of the protective layer 240. The second electrode 335 of each of the plurality of subpixels and the auxiliary electrode 800 are electrically connected to each other. In some embodiments, the side of the auxiliary electrode 800 and the lower surface of the protective layer 240 form a space between the protective layer 240 and the substrate SUB. The second electrode 335 of at least one subpixel from the plurality of subpixels extends into the space to be in contact with the side of the auxiliary electrode, such that the second electrode 335 is electrically connected to the auxiliary electrode 800.

In some embodiments, the undercut structure body UCS includes a first undercut structure on a first side (e.g., left side) of the undercut structure body UCS and a second undercut structure on a second side (e.g., right side) of the undercut structure body UCS. The first side and the second side oppose each other. The second electrode 335 of a first subpixel (e.g., on the left) is disposed in the undercut area UCA adjacent to the first undercut structure of the undercut structure body UCS. The second electrode of the first subpixel extends into a space of the first undercut structure UC to be in contact with the first side of the auxiliary electrode 800. Similarly, the second electrode 335 of a second subpixel (e.g., on the right) is disposed in the undercut area UCA adjacent to the second undercut structure UC of the undercut structure body UCS. The second electrode 335 of the second subpixel extends into a space of the second undercut structure UCS to be in contact with the second side of the auxiliary electrode 800. As such, the second electrode 335 of the first subpixel is electrically connected to the second electrode 335 of the second subpixel by the auxiliary electrode 800 of the undercut structure body UCS.

Referring to FIG. 7, the undercut structure body (UCS) may include an undercut structure (UC) in which the auxiliary electrode (800) enters an inner side of a lower part of the protective layer (240).

The auxiliary electrodes (800) may be disposed on the same layer as that of the source/drain electrodes or the gate electrodes. For example, in a case in which the display device (100) according to embodiments of the present disclosure has a top emission structure, the auxiliary electrodes (800) may be disposed in the same layer as that of the source/drain electrodes and may include the same material as that of the source/drain electrodes. On the other hand, in a case in which the display device (100) according to embodiments of the present disclosure has a bottom emission structure, the auxiliary electrodes (800) may be disposed in the same layer as that of the gate electrodes and may include the same material as that of the gate electrodes.

Referring to FIG. 7, the light emitting layer (333) and the second electrode (335) may be disposed in the undercut area (UCA) with being cut off in accordance with the undercut structure (UC). In other words, the light emitting layer (333) of subpixels adjacent to each other among a plurality of subpixels is not continuously disposed but is disposed with being cut off. In addition, the second electrodes (335) of subpixels adjacent to each other in a plurality of subpixels are not continuously disposed but are disposed with being cut off. In other words, the second electrode (335) and the metal layer (710) provided in the undercut area (UCA) may be electrically disconnected in accordance with the undercut structure (UC).

Referring to FIG. 7, the undercut structure body (UCS) includes a voltage line (VSSL) disposed on the substrate (SUB) and a buffer layer (220) disposed on the voltage line (VSSL), and the auxiliary electrode (800) may be electrically connected to the voltage line (VSSL). In other words, the auxiliary electrode (800) may be electrically connected to the voltage line (VSSL) through a contact hole provided in the buffer layer (220). In some embodiments, a portion of the auxiliary electrode 800 penetrates the buffer layer 220 to be in contact with the voltage line VSSL, such that the auxiliary electrode 800 is electrically connected to the voltage line VSSL.

The voltage line (VSSL) may be a common voltage line (VSSL) that supplies a low electric potential common voltage (EVSS).

Referring to FIG. 7, a side face of the light emitting layer (333) provided in the undercut area (UCA) may be covered with the second electrode (335).

According to embodiments of the present disclosure, by electrically connecting the second electrode that is a common electrode to the voltage line through the auxiliary electrode, a display device capable of improving luminance uniformity by alleviating a voltage drop occurring in the second electrode by enhancing resistance of the second electrode can be provided.

In addition, according to the embodiments of the present disclosure, by covering the side face of the light emitting layer (333) with the second electrode (335), a display device capable of delaying a time for penetration of moisture and oxygen into the display region in an adjacent server pixel can be provided.

FIGS. 8A to 8F are exemplary diagrams illustrating a method for manufacturing the undercut area illustrated in FIG. 3B, and FIGS. 9A to 9F are exemplary diagrams illustrating a method for manufacturing the undercut area illustrated in FIG. 4B.

Figure 8A:
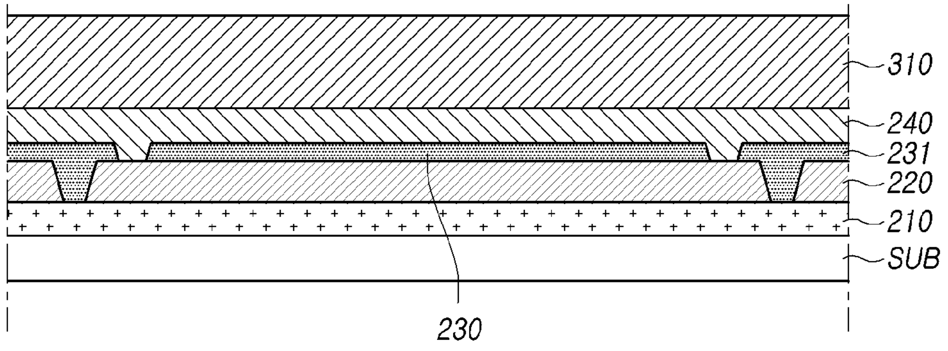
FIGS. 8A to 8F are exemplary diagrams illustrating a method for manufacturing the undercut area illustrated in FIG. 3B according to embodiments of the present disclosure.
Figure 9A:
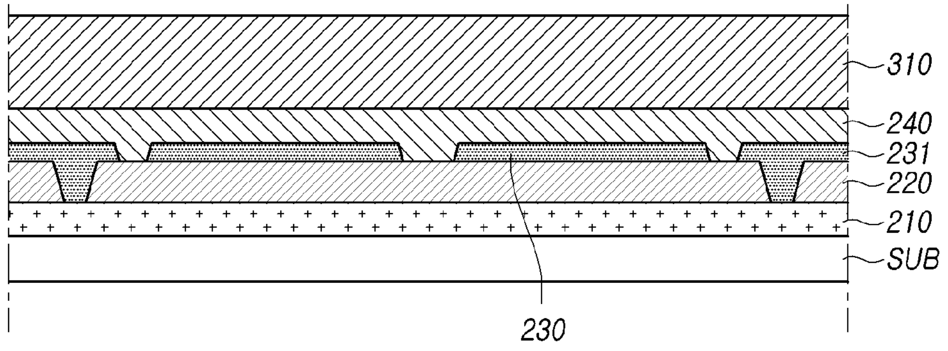
FIGS. 9A to 9F are exemplary diagrams illustrating a method for manufacturing the undercut area illustrated in FIG. 4B according to embodiments of the present disclosure.

Referring to FIGS. 8A and 9A, the method for manufacturing a display device according to embodiments of the present disclosure may include a step of forming metal layers (230, 231) on a substrate (SUB) and a step of sequentially forming a protective layer (240) and a planarization layer (310) on the metal layers (230, 231).

A light shield layer (210) and a buffer layer (220) may be sequentially formed between the substrate (SUB) and the metal layers (230, 231).

After a contact hole is formed in the buffer layer (220), the metal layers (230, 231) formed on the buffer layer (220) and the light shield layer (210) may be electrically connected.

Referring to FIGS. 3B and 4B, although the metal layer (230) and the metal pattern (230*a*) are provided in FIG. 3B, the metal layer (230) and the metal pattern (230*a*) are removed in FIG. 4B, which is different from FIG. 3B.

In other words, the metal layer (230) may be either formed or not formed under a protective layer (240) of an undercut structure body (UCS) to be formed later in accordance with the step of forming the metal layers (230, 231) on the buffer layer (220).

First, referring to FIG. 8A, after the metal layer (230) is continuously formed in an area in which an undercut structure body (UCS) is to be formed later on the buffer layer (220), a protective layer (240) and a planarization layer (310) are sequentially formed through deposition.

On the other hand, referring to FIG. 9A, without continuously forming the metal layer (230) in an area in which an undercut structure body (UCS) is to be formed later on the buffer layer (220), after the metal layer (230) is formed such that the buffer layer is exposed in a partial area, a protective layer (240) and a planarization layer (310) are sequentially formed through deposition.

Figure 8B:
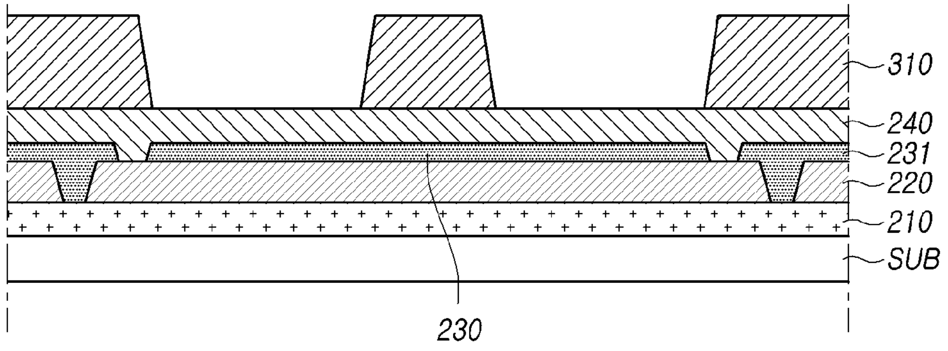
Figure 9B:
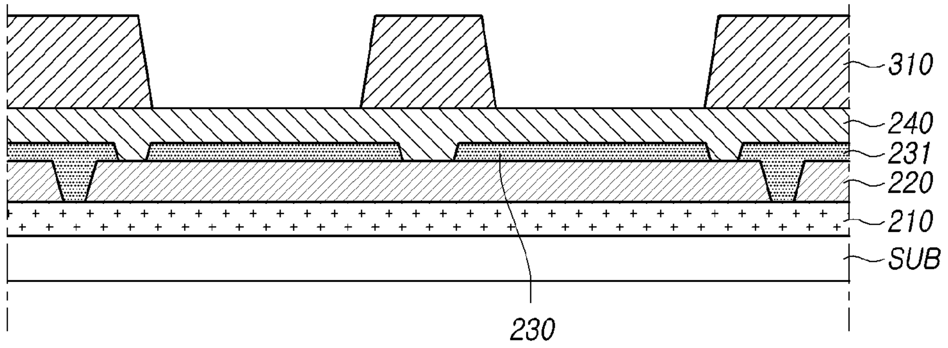

Referring to FIGS. 8B and 9B, the planarization layer (310) is patterned using an integrated mask, and a planarization hole is formed such that the protective layer (240) is exposed.

Figure 8C:
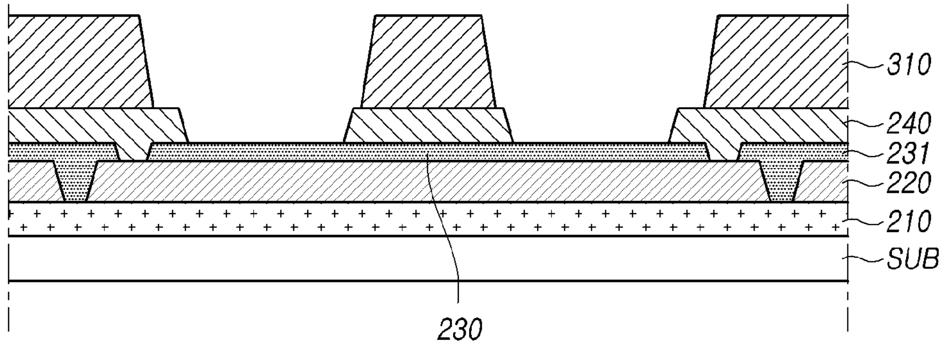
Figure 9C:
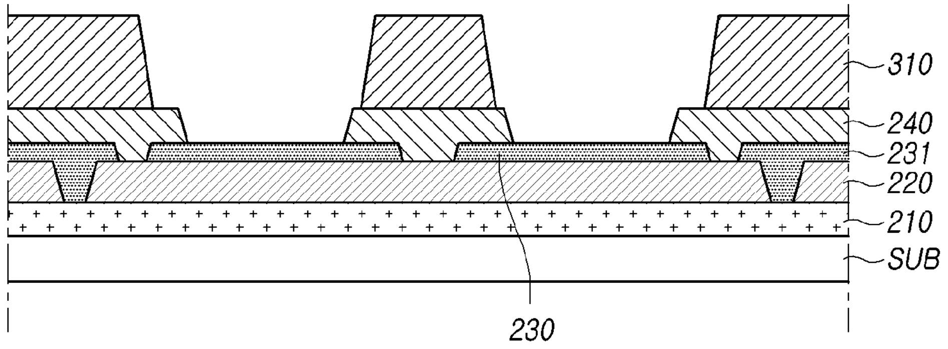

Referring to FIGS. 8C and 9C, the protective layer (240) is patterned using the integrated mask used in the process of patterning the planarization layer (310), and a protective layer hole is formed such that the metal layer (230) is exposed.

Figure 8D:
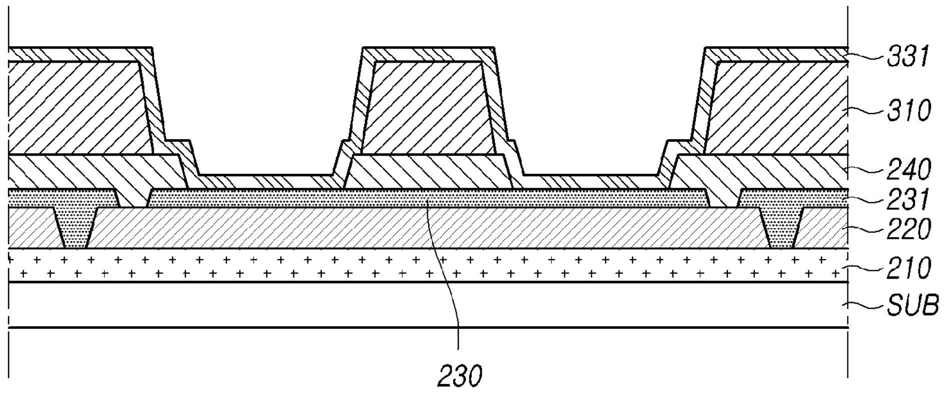
Figure 9D:
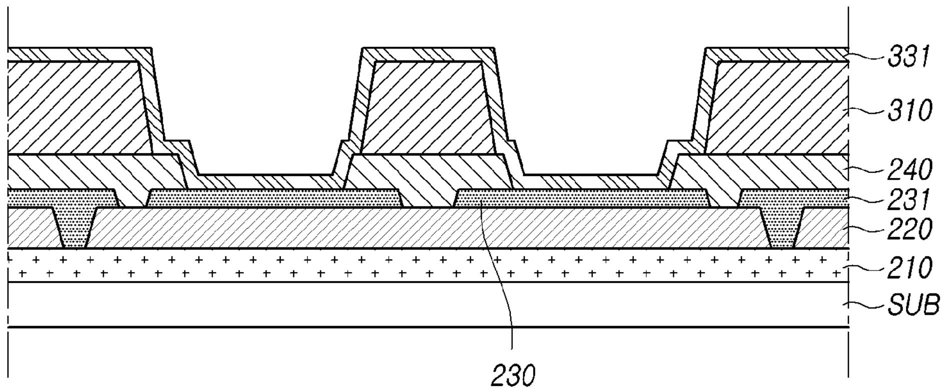

Referring to FIGS. 8D and 9D, an electrode material (331) is formed on the entire surface of the planarization layer (310), the protective layer (240), and the metal layer (230).

Figure 8E:
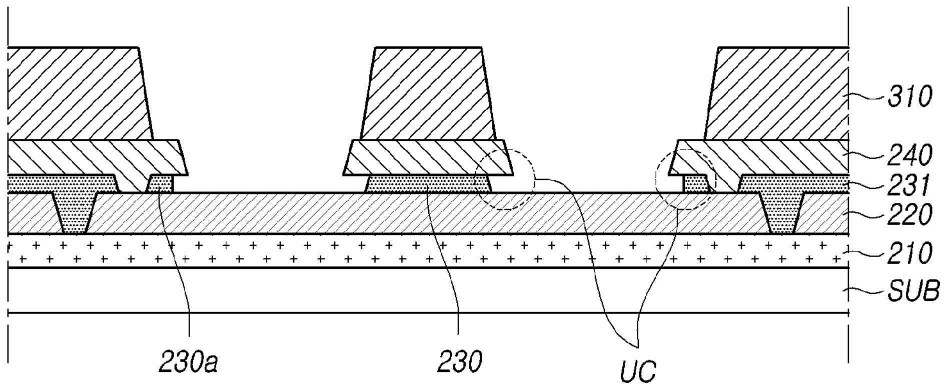
Figure 9E:
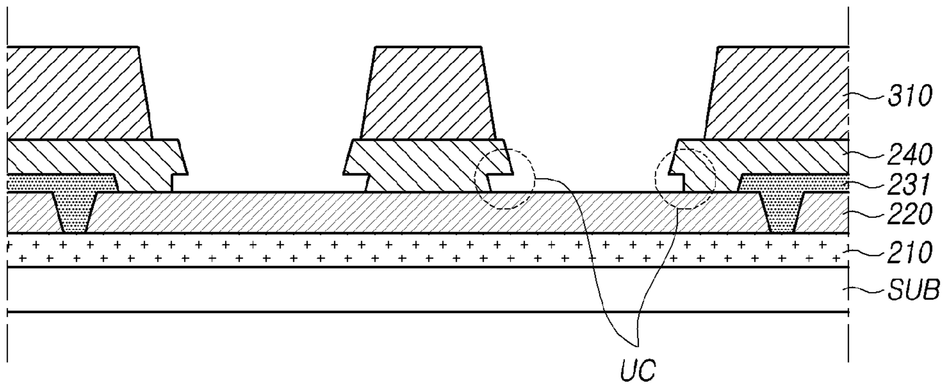

Referring to FIGS. 8E and 9E, the electrode material (331) and the metal layer (230) are simultaneously etched and removed using an etching solution that simultaneously etches the electrode material (331) and the metal layer (230).

Referring to FIG. 8E, an undercut structure (UC) may be formed in an edge lower area of the protective layer (240) by etching the metal layer (230) up to the inner side of an edge lower part of the protective layer (240), and the metal layer (230) remains without being etched in an inner area of the protective layer (240).

On the other hand, referring to FIG. 9E, by performing etching for a sufficient time such that the whole metal layer (230) is etched up to the inner side of the edge lower part of the protective layer (240), an undercut structure (UC) may be formed in the edge lower part area of the protective layer (240).

Figure 8F:
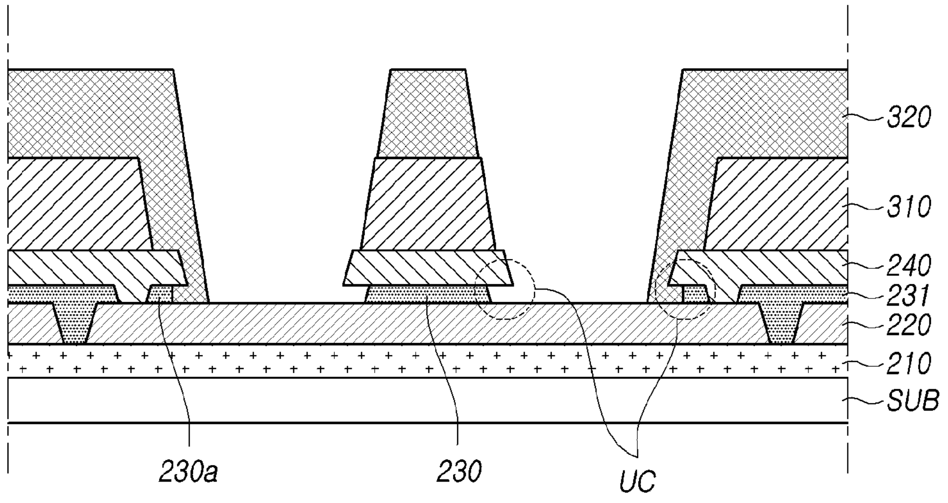
Figure 9F:
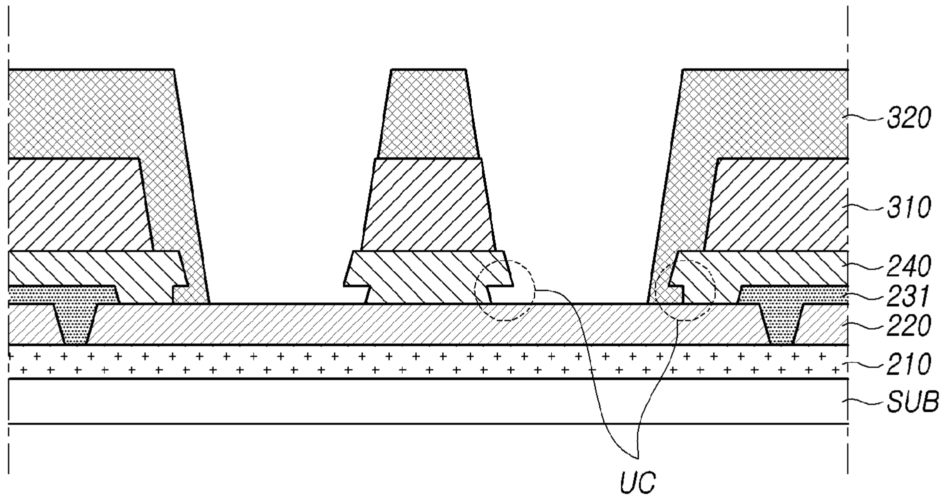

Referring to FIGS. 8F and 9F, a bank layer (320) may be formed on the planarization layer (310). In such a case, the bank layer (320) may be formed to cover the undercut structure (UC) in the undercut area except for the undercut structure body.

According to the embodiments of the present disclosure, by using a common mask in formation of a protective layer and a planarization layer and forming an undercut structure by commonly removing the electrode material and the metal layer, a method for manufacturing a display device that enables process optimization can be provided.

The embodiments of the present disclosure described above can be briefly summarized below.

Embodiments of the present disclosure can provide a display device including: a substrate in which a display region displaying an image using a plurality of subpixels and a non-display region surrounding the display region are provided: a metal layer disposed on the substrate: a protective layer disposed on the metal layer: and an undercut area disposed along a boundary between the display region and the non-display region, wherein the undercut area includes an undercut structure in which an edge of the protective layer is projected.

A display device in which the undercut area includes an undercut structure including a metal pattern in which the metal layer enters an inner side of a lower part of the protective layer can be provided.

A display device according to embodiments of the present disclosure may include an undercut structure body disposed in the undercut area along the display region.

In a display device according to embodiments of the present disclosure, the undercut structure body may include an undercut structure in which an edge of the protective layer is projected.

A display device according to embodiments of the present disclosure may include a metal layer in a lower part of the protective layer, and the undercut structure body may be formed using an undercut structure in which the metal layer enters an inner side of a lower part of the protective layer.

A display device according to embodiments of the present disclosure may include: a planarization layer disposed on the protective layer: and a bank layer disposed on the planarization layer, and the bank layer may cover the undercut structure.

A display device according to embodiments of the present disclosure may include: a light emitting layer disposed on the protective layer; and a second electrode disposed on the light emitting layer, and the lighting emitting layer and the second electrode may be disposed in the undercut area with being cut off in accordance with the undercut structure.

In a display device according to embodiments of the present disclosure, a side face of the light emitting layer provided in the undercut area may be covered with the second electrode.

In a display device according to embodiments of the present disclosure, the undercut area may be disposed in the display region or the non-display region.

Embodiments of the present disclosure can provide a display device including: a plurality of subpixels each including a light emission area and a non-light emission area; a substrate in which a display region displaying an image using the plurality of subpixels is provided: a metal layer disposed on the substrate: a protective layer disposed on the metal layer; and an undercut area disposed between the light emission areas included in the plurality of subpixels, wherein the undercut area is formed using an undercut structure in which the metal layer enters an inner side of a lower part of the protective layer.

A display device according to embodiments of the present disclosure may include: a first electrode disposed on the protective layer: a light emitting layer disposed on the first electrode; and a second electrode disposed on the light emitting layer, and the light emitting layer and the second electrode may be disposed in the undercut area with being cut off in accordance with the undercut structure.

In a display device according to embodiments of the present disclosure, a side face of the light emitting layer provided in the undercut area may be covered with the second electrode.

In a display device according to embodiments of the present disclosure, the second electrode and the metal layer provided in the undercut area may be electrically disconnected in accordance with the undercut structure.

Embodiments of the present disclosure can provide a display device including: a substrate in which a display region displaying an image using a plurality of subpixels is provided: a light emitting layer disposed in each of the plurality of subpixels on the substrate; a second electrode disposed on the light emitting layer: and an undercut area including an undercut structure body disposed between the plurality of subpixels, the undercut structure body includes: an auxiliary electrode disposed on the substrate; and a protective layer disposed on the auxiliary electrode, and the second electrode and the auxiliary electrode are electrically connected to each other.

In a display device according to embodiments of the present disclosure, the undercut structure body may be formed using an undercut structure in which the auxiliary electrode enters an inner side of a lower part of the protective layer.

In a display device according to embodiments of the present disclosure, the light emitting layer and the second electrode may be disposed in the undercut area with being cut off in accordance with the undercut structure.

In a display device according to embodiments of the present disclosure, the undercut structure body may include: a voltage line disposed on the substrate; and a buffer layer disposed on the voltage line, and the auxiliary electrode may be electrically connected to the voltage line.

In a display device according to embodiments of the present disclosure, a side face of the light emitting layer provided in the undercut area may be covered with the second electrode.

Embodiments of the present disclosure can provide a method for manufacturing a display device, the method including: forming a metal layer on a substrate: sequentially forming a protective layer and a planarization layer on the metal layer: sequentially patterning the planarization layer and the protective layer: forming an electrode material on the planarization layer, the protective layer, and the metal layer; and simultaneously etching the electrode material and the metal layer, in which an undercut structure in which the metal layer is etched to an inner side of a lower part of the protective layer is included.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention.

What is claimed is:

1. A display device comprising:

a substrate comprising a display region displaying an image using a plurality of subpixels and a non-display region surrounding the display region, at least one subpixel among the plurality of subpixels comprising a first electrode, a light emitting layer, and a second electrode;

an undercut area disposed between the display region and the non-display region;

a metal layer disposed on the substrate, wherein at least a part of the metal layer is disposed in the undercut area; and a protective layer disposed on the metal layer, the protective layer comprising an insulating material to serve as an insulating film, wherein at least a part of the protective layer is disposed in the undercut area;

wherein at least a portion of the protective layer protrudes further than a side of the metal layer or a side of the protective layer below the portion of the protective layer to form an undercut structure, and wherein the undercut structure exposes a lower surface of the protruding portion of the protective layer.

2. The display device according to claim 1, wherein a metal pattern is disposed in a space formed by the lower surface of the protruding portion of the protective layer and the side of the protective layer below the protruding portion of the protective layer, and the protruding portion of the protective layer protrudes further than a side of the metal pattern to form the undercut structure.

3. The display device according to claim 1, wherein the part of the metal layer, the part of the protective layer, and the undercut structure are included in an undercut structure body disposed in the undercut area, and wherein a second portion of the protective layer protrudes further than a second side of the metal layer.

4. The display device according to claim 3, wherein the portion of the protective layer protrudes further than the side of the protective layer.

5. The display device according to claim 4, wherein a second portion of the protective layer protrudes further than a second side of the protective layer to expose a lower surface of the second portion of the protective layer.

6. The display device according to claim 1 comprising:

a planarization layer disposed on the protective layer; and a bank layer disposed on the planarization layer, wherein the bank layer covers the undercut structure.

7. The display device according to claim 1, wherein the light emitting layer is disposed over the protective layer, wherein a first portion of the light emitting layer is in the undercut area, and a second portion of the light emitting layer is in an area adjacent to the undercut area, wherein the second electrode is disposed on the light emitting layer, wherein a first portion of the second electrode is in the undercut area, and a second portion of the second electrode is in the area adjacent to the undercut area, and wherein the first portion of the light emitting layer and the first portion of the second electrode in the undercut area are electrically disconnected from the second portion of the light emitting layer and the second portion of the second electrode in the area adjacent to the undercut area by the undercut structure.

8. The display device according to claim 7, wherein a side face of the second portion of the light emitting layer is covered with the second portion of the second electrode.

9. The display device according to claim 1, wherein the undercut area is in the display region or the non-display region.

10. A display device comprising:

a substrate having a display region;

a plurality of subpixels on the substrate in the display region, the plurality of subpixels including a plurality of light emission areas and a non-light emission area, each of the plurality of light emission areas corresponding to one of the plurality of subpixels that comprises a first electrode, a light emitting layer, and a second electrode, and the non-light emission area between the plurality of light emission areas;

a metal layer disposed on the substrate in the display region; and a protective layer disposed on the metal layer, the protective layer comprising an insulating material to serve as an insulating film, wherein at least a portion of the protective layer protrudes further than a side of the metal layer to form an undercut structure, and wherein the undercut structure exposes a lower surface of the protruding portion of the protective layer.

11. The display device according to claim 10, a wherein the first electrode is disposed on the protective layer, wherein the light emitting layer is disposed on the first electrode, wherein the second electrode is disposed on the light emitting layer, and wherein the light emitting layer and the second electrode are disposed in an undercut area, such that the light emitting layer and the second electrode are electrically disconnected from another light emitting layer of another subpixel adjacent to the subpixel and another second electrode of the another subpixel.

12. The display device according to claim 11, wherein a side face of the light emitting layer provided in the undercut area is covered with the second electrode.

13. The display device according to claim 11, wherein the second electrode and the metal layer in the undercut area are electrically disconnected by the undercut structure.

14. A display device comprising:

a substrate comprising a display region displaying an image;

a plurality of subpixels, each subpixel of the plurality of subpixels comprising:

a light emitting layer disposed in the subpixel on the substrate; and a second electrode disposed on the light emitting layer;

an undercut area disposed between the plurality of subpixels;

an undercut structure body in the undercut area, the undercut structure body comprising:

an auxiliary electrode disposed on the substrate in the undercut area; and a protective layer disposed on the auxiliary electrode in the undercut area, wherein at least a portion of the protective layer protrudes further than a side of the auxiliary electrode to form an undercut structure, wherein the undercut structure exposes a lower surface of the protruding portion of the protective layer, and wherein the second electrode of each of the plurality of subpixels and the auxiliary electrode are electrically connected to each other.

15. The display device according to claim 14, wherein the side of the auxiliary electrode and the lower surface of the protective layer form a space between the protective layer and the substrate, and wherein the second electrode of at least one subpixel from the plurality of subpixels extends into the space to be in contact with the side of the auxiliary electrode, such that the second electrode is electrically connected to the auxiliary electrode.

16. The display device according to claim 14, wherein:

the undercut structure body includes a first undercut structure on a first side of the undercut structure body and a second undercut structure on a second side of the undercut structure body, the first side and second side opposing each other, the second electrode of a first subpixel is disposed in the undercut area adjacent to the first undercut structure of the undercut structure body, the second electrode of the first subpixel extending into a space of the first undercut structure to be in contact with the first side of the auxiliary electrode, and the second electrode of a second subpixel is disposed in the undercut area adjacent to the second undercut structure of the undercut structure body, the second electrode of the second subpixel extending into a space of the second undercut structure to be in contact with the second side of the auxiliary electrode such that the second electrode of the first subpixel are electrically connected to the second electrode of the second subpixel by the auxiliary electrode of the undercut structure body.

17. The display device according to claim 14, wherein the undercut structure body further includes:

a voltage line disposed on the substrate; and a buffer layer disposed on the voltage line, and wherein a portion of the auxiliary electrode penetrates the buffer layer to be in contact with the voltage line, such that the auxiliary electrode is electrically connected to the voltage line.

18. The display device according to claim 14, wherein a side face of the light emitting layer in the undercut area is covered with the second electrode.

19. The display device according to claim 14, wherein the undercut structure body is rectangular shaped, and wherein the undercut structure is disposed along an outer edge of the rectangular shaped undercut structure body.

20. The display device according to claim 19, wherein the undercut structure body is surrounded by four subpixels, each corresponding to a corner of the rectangular shaped undercut structure body.

* * * * *